United States Patent [19]

Pernyeszi

[11] 4,395,645
[45] Jul. 26, 1983

[54] MOSFET LOGIC INVERTER BUFFER CIRCUIT FOR INTEGRATED CIRCUITS

[75] Inventor: Joseph Pernyeszi, Fairfield, Conn.

[73] Assignee: International Telephone and Telegraph Corporation, New York, N.Y.

[21] Appl. No.: 213,533

[22] Filed: Dec. 5, 1980

[51] Int. Cl.³ .................. H03K 19/094; H03K 19/20; H03K 17/687; H03K 3/353
[52] U.S. Cl. .................................. 307/450; 307/475; 307/581; 307/270; 307/279
[58] Field of Search .............. 307/448, 449, 450, 451, 307/463, 475, 270, 279, 443, 581

[56] References Cited

U.S. PATENT DOCUMENTS

| | | | |
|---|---|---|---|
| 3,983,420 | 9/1976 | Kikuchi | 307/450 X |
| 3,995,172 | 11/1976 | Freeman et al. | 307/450 X |
| 4,004,170 | 1/1977 | Henke | 307/279 |
| 4,042,839 | 8/1977 | Araki | 307/450 |
| 4,103,189 | 7/1978 | Perlegos et al. | 307/270 |
| 4,264,829 | 4/1981 | Misaizu | 307/450 |
| 4,280,065 | 7/1981 | Minato et al. | 307/448 X |

*Primary Examiner*—Larry N. Anagnos
*Attorney, Agent, or Firm*—John T. O'Halloran; Alfred C. Hill

[57] ABSTRACT

The inverter buffer circuit disclosed includes two transistorized circuits each coupled to an input circuit and an output circuit capable of carrying high current and providing full output swing between a high voltage or binary "1" and a low voltage or binary "0". Each of the two circuits include a first enhancement field effect transistor having its drain electrode connected to a drain voltage and operating as a source follower, a first depletion field effect transistor having its drain electrode and source electrode connected to back bias acting as a load for the first enhancement transistor, second and third enhancement field effect transistors having their source electrodes coupled to the back bias and interconnected to form a flip-flop controlled by the first enhancement transistor and a second depletion field effect transistor having its drain electrode coupled to the drain voltage and acting as the load for the flip-flop. The output circuit includes two depletion field effect transistors connected in series between the drain voltage and source voltage with the gate electrodes thereof connected to a different one of the two flip-flops and an output terminal coupled to the series connection between the two depletion transistors. Three embodiments of the input circuit are disclosed.

22 Claims, 5 Drawing Figures

MOSFET LOGIC INVERTER BUFFER CIRCUIT FOR INTEGRATED CIRCUITS

BACKGROUND OF THE INVENTION

The present invention relates to logic switching circuitry which employs MOSFET devices and more particularly to an improved high efficiency, high current inverter buffer circuit for integrated circuits.

Digital data processing systems have been fabricated as large-scale integrated (LSI) circuits using metal-oxide-semiconductor field effect transistor (MOSFET) technology for some time.

One of the major disadvantages heretofore associated with MOSFET circuits has been the relatively large number of supply voltages, and the relatively high magnitude of supply voltages required to operate the circuit efficiently. The higher number of supply voltages increases the complexity of the external circuitry associated with the MOS integrated chips, and also increases the number of pins required to interface the integrated circuit package with the external circuitry. The higher voltage results in greater power dissipation and requires larger geometries to provide the necessary voltage breakdown characteristics.

One of the fundamental circuits required in a MOSFET integrated circuit is an inverter buffer to drive a load in which a resistive type load interconnects the drain voltage to the inverter output and an enhancement mode transistor connects the output to the source voltage. When the enhancement mode transistor is switched off, the output is at drain voltage, which is typically referred to as the logic or binary "1" level. When the enhancement mode transistor is switched on, the output is pulled down to a level near the source voltage, which is typically referred to as the binary or logic "0" level. The logic "0" level depends on the relative resistance of the enhancement mode transistor to that of the resistive type load. Although the use of a simple resistor as the load has the advantage that one of the output levels is the drain supply voltage, the circuit is not practical in integrated circuit form because a diffused region having a resistance sufficiently large to provide a low level of power dissipation occupies a prohibitively large area.

One substitute for a diffused load resistor is an enhancement mode transistor in which the gate is connected to the drain supply voltage. However, this circuit has the disadvantage that the logic "1" level of the output can reach a potential equal only to the drain voltage $V_D$ less the threshold voltage $V_T$ of the load transistor, which is typically several volts. Another disadvantage is that the output current of the load device decreases very rapidly as the magnitude of the voltage on the output, which is the source voltage of the load transistor, increases.

These objections to the use of an enhancement mode transistor as a load can be remedied by applying a voltage $V_G$ to the gate of the transistor of greater magnitude than the drain voltage, but this requires an additional supply voltage. In addition, such a circuit exhibits undesirable nonlinearity in the output current of the inverter circuit because as the output voltage approaches drain voltage, both the source to drain voltage and the source to gate voltage of the load transistor decreases.

The logic "1" level at the output of the inverter circuit can be raised to $V_D$ without the use of a higher gate voltage $V_G$ by means of a so-called boot strap inverter. However, the boot strap circuits require additional devices and have other disadvantages. Still another circuit which has been used is the complementary inverter having an n-channel enhancement mode transistor connected to the negative voltage supply and a p-channel enhancement mode transistor connected to the positive voltage supply, with the common drains being the output. The gates of the transistors are connected together and receive the input signal. When the input signal is negative, the n-channel enhancement mode device is turned off, the p-channel enhancement mode device is turned on, and the output is at the level of the positive supply voltage. When the input signal is positive, the n-channel device is on, the p-channel device is off, and the output is at the level of the negative supply voltage. Such a complementary inverter provides good switching characteristics and requires only one supply voltage. However, the use of both n-channel and p-channel devices requires an unusually large amount of area on an integrated circuit chip, and also requires several additional processing steps which significantly increases the cost of the circuit.

The inverter circuit shown in FIG. 1 and fully described in U.S. Pat. No. 3,775,693 comprises the depletion mode (D) MOS transistor Q1 connecting the drain supply voltage $V_D$ to the output of the circuit with the gate thereof being electrically coupled with the output. An enhancement mode (E) MOS transistor Q2 having the same type channel as transistor Q1 provides a path connecting the output of the circuit to a source voltage supply $V_S$ illustrated as ground. The gate of transistor Q2 forms the input to the inverter circuit. The inverter circuit of FIG. 1 is useful for both p-channel and n-channel integrated circuits, and has the advantage of providing an output logic "1" level when the enhancement mode device transistor Q2 is switched off that is substantially equal to the drain supply voltage, thus requiring only one voltage supply. Transistor Q2, when switched on, pulls the output down to the source supply voltage $V_S$. The advantage of this circuit is its simplicity. The disadvantage is that the circuit operates in class A operation, that is, it constantly draws the same amount of current in its pull-up condition. The enhancement device transistor Q2 in order to pull down the output to logic "0" has to carry the current from the outside and also the current carried by the depletion device transistor Q1. An enhancement device having the same size as a depletion device carries less current than the depletion device and, as a result, the enhancement device must be made quite large to carry the current of the depletion device and thereby requires a large amount of area on an integrated circuit chip.

FIG. 2. discloses another prior art circuit disclosed in the above cited patent incorporating the circuit of FIG. 1 and having added thereto to improve its performance a push-pull output stage comprising a pair of transistors Q3 and Q4 connected in series between the drain voltage $V_D$ and the source voltage $V_S$. Transistor Q4 connected to the source voltage is an enhancement mode device, and transistor Q3 connected to the drain voltage is preferably a depletion mode device. The output from the basic inverter stage, including transistors Q1 and Q2, is coupled to the gate of the depletion mode transistor Q3 and the gate of the enhancement mode transistor Q4 is connected to the logic input to the basic inverter stage. The output of the basic circuit of transistors Q1 and Q2 will turn off transistor Q3 when the output has to be low, therefore, removing the necessity of the transistor Q4 from having to carry the current passing through transistor Q3. When the output is to go high, the gate of transistor Q3 is driven high with very little delay (delay of transistors Q1 and Q2) making its gate to source voltage positive causing very strong conduction and, thereby, shortening the rise time at the output.

SUMMARY OF THE INVENTION

An object of the present invention is to provide an improved inverter buffer circuit for an integrated circuit having rapid switching time and a decreased rise time relative to the rise time of the above described prior art devices.

Another object of the present invention is to provide an inverter buffer circuit for an integrated circuit having higher efficiency, higher current carrying capabilities and a shorter rise time than capable of being provided by the above described prior art circuitry.

A feature of the present invention is the provision of a buffer circuit as described herein for an integrated circuit comprising an input circuit; two transistorized circuits coupled to the input circuit, each of the two circuits including a first enhancement field effect transistor having a gate electrode, a source electrode, and a drain electrode coupled to a drain voltage source, a first depletion field effect transistor having a gate electrode coupled to a back bias source, a source electrode coupled to the back bias source, and a drain electrode coupled to the source electrode of the first enhancement transistor, a second enhancement field effect transistor having a gate electrode, a drain electrode coupled to the drain electrode of the first depletion transistor and the source electrode of the first enhancement transistor, and a source electrode coupled to the source electrode of the first depletion transistor and the back bias source, a second depletion field effect transistor having a gate electrode, a drain electrode coupled to the drain voltage source, and a source electrode coupled to the gate electrode of the second enhancement transistor, and a third enhancement field effect transistor having a drain electrode coupled to the source electrode of the second depletion transistor and the gate electrode of the second enhancement transistor, a source electrode coupled to the back bias source, and a gate electrode coupled to the drain electrode of the second enhancement transistor and the source electrode of the first enhancement transistor; and an output circuit coupled to each of the two circuits, the drain voltage source and a source voltage source.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

The letter E is employed to identify enhancement mode transistors and the letter D is employed to identify depletion mode transistors employed in the circuits of FIGS. 1-5.

Figure 3:
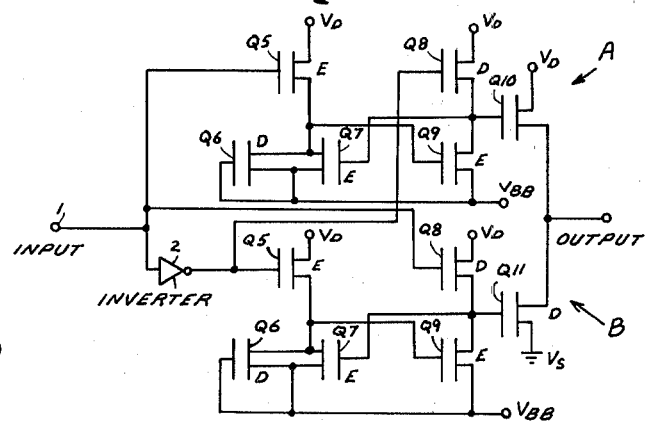
FIG. 3 is a schematic illustration of an inverter buffer circuit in accordance with the principles of the present invention.
Figure 1:
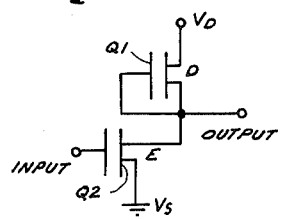
FIG. 1 is a schematic illustration of a prior art device described hereinabove under the heading "Background of the Invention"
Figure 4:
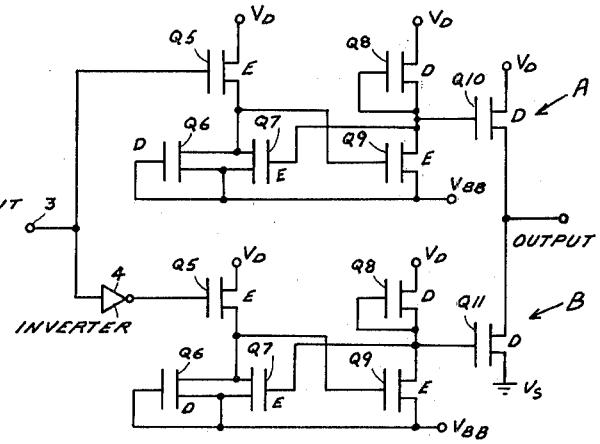
FIG. 4 is a schematic diagram of a second embodiment of an inverter buffer circuit in accordance with the principles of the present invention.
Figure 2:
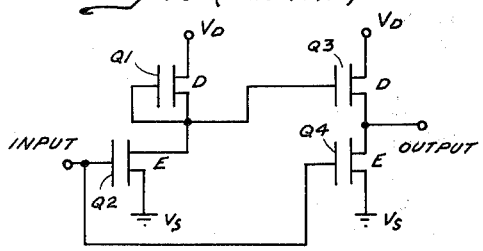
FIG. 2 is a second embodiment of the prior art device described hereinabove under the heading "Background of the Invention"
Figure 5:
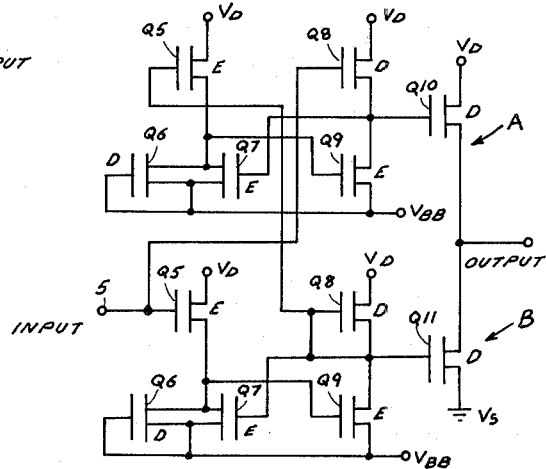
FIG. 5 is a schematic diagram of a third embodiment of an inverter buffer circuit in accordance with the principles of the present invention.

It is to be understood that in the circuitry of FIGS. 3-5 the transistors employed may be either of a p-channel type device or an n-channel type device. The n-channel enhancement mode and depletion mode devices function in the same manner as p-channel enhancement mode and depletion mode devices, except that the plurality of the voltages involved is reversed. Accordingly, the term "low voltage" or logic "0" levels refers to the source voltage which is shown as ground potential, and the term "high voltage" or logic "1" refers to the drain voltage, which is a negative voltage for p-channel devices, and a positive voltage for n-channel devices. Typically, the drain voltage for p-channel devices would be from $-5.0$ volts to $-17.0$ volts, and for n-channel devices would be $+5.0$ volts to $+17.0$ volts.

Referring to FIGS. 3-5, the inverter buffer circuit in accordance with the principles of the present invention each include two circuits A and B with each of these circuits including an enhancement mode transistor Q5 operating as a source follower which performs level shifting with a depletion mode transistor Q6 providing the load for transistor Q5. Enhancement mode transistor Q7 and enhancement mode transistor Q9 are interconnected as a flip-flop which is controlled by transistor Q5. The depletion mode transistor Q8 provides a controlled load for the flip-flop.

It should be noted that in each of the three embodiments the gate electrode of transistor Q6, the source electrode of transistors Q6 and Q7 and the source electrode of transistor Q9 are coupled to a source of back bias which may have a value of $-3$ volts in the case of n-channel devices and a value of $+3$ volts in the case of p-channel devices.

The input circuit for these three embodiments vary one from the other depending on the internal connection present in the circuits A and B. Referring to FIG. 3, the input circuit includes an input terminal 1 connected directly to the gate of transistor Q5 of the circuit A and the gate of transistor Q8 of the circuit B and an inverter 2 having its input coupled to input terminal 1 and its output coupled to the gate electrode of transistor Q5 of the circuit B and the gate electrode of transistor Q8 of the circuit A.

Referring to FIG. 4, the gate electrode of transistor Q8 of both circuits A and B is connected directly to the source electrode thereof. In this embodiment with the above connection between the gate and source electrodes of transistors Q8, the input circuit includes an input terminal 3 connected directly to the gate electrode of transistor Q5 of the circuit A and an inverter 4 having its input connected to input terminal 3 and its output connected to the gate electrode of transistor Q5 of the circuit B.

Referring to the embodiment of FIG. 5, the gate electrode of transistor Q5 of the circuit A is connected directly to the gate electrode of transistor Q8 of the circuit B and also to the source electrode of transistor Q8 of the circuit B. With this connection between the circuits A and B, the input circuit includes an input terminal 5 connected directly to the gate electrode of transistor Q5 of the circuit B and the gate electrode of transistor Q8 of the circuit A. The circuitry of FIG. 5 enables the elimination of the inverter employed in the input circuitry of the embodiments of FIGS. 3 and 4 and, thus, enables a reduction in the cost of integrating this circuit with respect to the circuit of FIGS. 3 and 4.

The output circuit of each of the embodiments of FIGS. 3-5 includes a depletion mode transistor Q10 having its drain electrode connected to the drain voltage source $V_D$ and its gate electrode connected to the source electrode-drain electrode junction of transistors Q8 and Q9 of the circuit A, a depletion mode transistor Q11 having its drain electrode connected to the source electrode of transistor Q10, its gate electrode connected to the junction of the source electrode-drain electrode of transistors Q8 and Q9 of the circuit B and its source electrode connected to source voltage source $V_S$ (ground) and an output terminal connected to the source-drain junction of transistors Q10 and Q11. The transistors Q10 and Q11 are large depletion devices capable of carrying high current and can provide full output swing between source voltage and drain voltage.

While I have described above the principles of my invention in connection with specific apparatus, it is to be clearly understood that this description is made only by way of example and not as a limitation to the scope of my invention as set forth in the objects thereof and in the accompanying claims.

I claim:

1. A buffer circuit for an integrated circuit comprising:

two transistorized circuits each including
a first enhancement field effect transistor having a gate electrode, a source electrode, and a drain electrode coupled to a drain voltage source,
a first depletion field effect transistor having a gate electrode coupled to a back bias source, a source electrode coupled to said back bias source, and a drain electrode coupled to said source electrode of said first enhancement transistor,
a second enhancement field effect transistor having a gate electrode, a drain electrode coupled to said drain electrode of said first depletion transistor and said source electrode of said first enhancement transistor, and a source electrode coupled to said source electrode of said first depletion transistor and said back bias source,
a second depletion field effect transistor having a gate electrode, a drain electrode coupled to said drain voltage source, and a source electrode coupled to said gate electrode of said second enhancement transistor, and
a third enhancement field effect transistor having a drain electrode coupled to said source electrode of said second depletion transistor and said gate electrode of said second enhancement transistor, a source electrode coupled to said back bias source, and a gate electrode coupled to said drain electrode of said second enhancement transistor and said source electrode of said first enhancement transistor;
an output circuit coupled to said source electrode of said second depletion transistor, said drain electrode of said third enhancement transistor and said gate electrode of said second enhancement transistor of each of said two circuits, said drain voltage source and a source voltage source; and
an input circuit coupled to at least a selected one of said gate electrode of said first enhancement transistor of one of said two circuits and said gate electrode of said second depletion transistor of the other of said two circuits and a selected one of said gate electrode of said first enhancement transistor of said other of said two circuits and said gate electrode of said second depletion transistor of said one of said two circuits.

2. A buffer circuit according to claim 1, wherein said back bias has a magnitude value intermediate said drain voltage and said source voltage.

3. A buffer circuit according to claims 1 or 2, wherein said output circuit includes
a third depletion field effect transistor having a source electrode, a drain electrode coupled to said drain voltage source, and a gate electrode coupled to said source electrode of said second depletion transistor of one said two circuits, said drain electrode of said third enhancement transistor of said one of said circuits and said gate electrode of said second enhancement transistor of said one of said two circuits;
a fourth depletion field effect transistor having a drain electrode coupled to said source electrode of said third depletion transistor, a source electrode coupled to said source voltage source, and a gate electrode coupled to said source electrode of said second depletion transistor of the other of said two circuits, said drain electrode of said third enhancement transistor of said other of said two circuits and said gate electrode of said second enhancement transistor of said other of said two circuits, and
an output terminal coupled to said source electrode of said third depletion transistor and said drain electrode of said fourth depletion transistor.

4. A buffer circuit according to claim 3, wherein said first, second and third enhancement transistors of each of said two circuits, said first and second depletion transistors of each of said two circuits and said third and fourth depletion transistors are p-channel devices.

5. A buffer circuit according to claim 4, wherein said input circuit includes
an input terminal coupled to said gate electrode of said first enhancement transistor of said one of said two circuits and said gate electrode of said second depletion transistor of said other of said two circuits, and
an inverter having an input coupled to said input terminal and an output coupled to said gate electrode of said first enhancement transistor of said other of said two circuits and said gate electrode of said second depletion transistor of said one of said two circuits.

6. A buffer circuit according to claim 4, wherein said gate electrode and said source electrode of said second depletion transistor of each of said two circuits are coupled to each other, and
said input circuit includes
an input terminal coupled to said gate electrode of said first enhancement transistor of said one of said two circuits, and
an inverter having an input coupled to said input terminal and an output coupled to said gate electrode of said first enhancement transistor of said other of said two circuits.

7. A buffer circuit according to claim 4, wherein
said gate electrode of said first enhancement transistor of said one of said two circuits is coupled to said gate electrode and said source electrode of said second depletion transistor of said other of said two circuits, and
said input circuit includes
an input terminal coupled to said gate electrode of said second depletion transistor of said one of said two circuits and said gate electrode of said first enhancement transistor of said other of said two circuits.

8. A buffer circuit according to claim 3, wherein
said first, second and third enhancement transistors of each of said two circuits, said first and second depletion transistors of each of said two circuits and said third and fourth depletion transistors are n-channel devices.

9. A buffer circuit according to claim 8, wherein
said input circuit includes
an input terminal coupled to said gate electrode of said first enhancement transistor of said one of said two circuits and said gate electrode of said second depletion transistor of said other of said two circuits, and
an inverter having an input coupled to said input terminal and an output coupled to said gate electrode of said first enhancement transistor of said other of said two circuits and said gate electrode of said second depletion transistor of said one of said two circuits.

10. A buffer circuit according to claim 8, wherein
said gate electrode and said source electrode of said second depletion transistor of each of said two circuits are coupled to each other, and
said input circuit includes
an input terminal coupled to said gate electrode of said first enhancement transistor of said one of said two circuits, and
an inverter having an input coupled to said input terminal and an output coupled to said gate electrode of said first enhancement transistor of said other of said two circuits.

11. A buffer circuit according to claim 8, wherein
said gate electrode of said first enhancement transistor of said one of said two circuits is coupled to said gate electrode and said source electrode of said second depletion transistor of said other of said two circuits, and said input circuit includes
an input terminal coupled to said gate electrode of said second depletion transistor of said one of said two circuits and said gate electrode of said first enhancement transistor of said other of said two circuits.

12. A buffer circuit according to claims 1 or 2, wherein
said first, second and third enhancement transistors and said first and second depletion transistors of each of said two circuits are p-channel devices.

13. A buffer circuit according to claim 12, wherein
said input circuit includes
an input terminal coupled to said gate electrode of said first enhancement transistor of one of said two circuits and said gate electrode of second depletion transistor of the other of said two circuits, and
an inverter having an input coupled to said input terminal and an output coupled to said gate electrode of said first enhancement transistor of said other of said two circuits and said gate electrode of said second depletion transistor of said one of said two circuits.

14. A buffer circuit according to claim 12, wherein
said gate electrode and said source electrode of said second depletion transistor of each of said two circuits are coupled to each other, and
said input circuit includes
an input terminal coupled to said gate electrode of said first enhancement transistor of one of said two circuits, and
an inverter having an input coupled to said input terminal and an output coupled to said gate electrode of said first enhancement transistor of the other of said two circuits.

15. A buffer circuit according to claim 12, wherein
said gate electrode of said first enhancement transistor of one of said two circuits is coupled to said gate electrode and said source electrode of said second depletion transistor of the other of said two circuits, and
said input circuit includes
an input terminal coupled to said gate electrode of said second depletion transistor of said one of said two circuits and said gate electrode of said first enhancement transistor of said other of said two circuits.

16. A buffer circuit according to claims 1 or 2, wherein
said first, second and third enhancement transistors and said first and second depletion transistors of each of said two circuits are n-channel devices.

17. A buffer circuit according to claim 16, wherein
said input circuit includes
an input terminal coupled to said gate electrode of said first enhancement transistor of one of said two circuits and said gate electrode of said second depletion transistor of the other of said two circuits, and
an inverter having an input coupled to said input terminal and an output coupled to said gate electrode of said first enhancement transistor of said other of said two circuits and said gate electrode of said second depletion transistor of said one of said two circuits.

18. A buffer circuit according to claim 16, wherein
said gate electrode and said source electrode of said second depletion transistor of each of said two circuits are coupled to each other, and
said input circuit includes
an input terminal coupled to said gate electrode of said first enhancement transistor of one of said two circuits, and
an inverter having an input coupled to said input terminal and an output coupled to said gate electrode of said first enhancement transistor of the other of said two circuits.

19. A buffer circuit according to claim 16, wherein
said gate electrode of said first enhancement transistor of one of said two circuits is coupled to said gate electrode and said source electrode of said second depletion transistor of the other of said two circuits, and
said inpput circuit includes an input terminal coupled to said gate electrode of said second depletion transistor of said one of said two circuits and said gate electrode of said first enhancement transistor of said other of said two circuits.

20. A buffer circuit according to claims 1 or 2, wherein
    said input circuit includes
        an input terminal coupled to said gate electrode of said first enhancement transistor of one of said two circuits and said gate electrode of said second depletion transistor of the other of said two circuits, and
        an inverter having an input coupled to said input terminal and an output coupled to said gate electrode of said first enhancement transistor of said other of said two circuits and said gate electrode of said second depletion transistor of said one of said two circuits.

21. A buffer circuit according to claims 1 or 2, wherein
    said gate electrode and said source electrode of said second depletion transistor of each of said two circuits are coupled to each other, and
    said input circuit includes
        an input terminal coupled to said gate electrode of said first enhancement transistor of one of said two circuits, and
        an inverter having an input coupled to said input terminal and an output coupled to said gate electrode of said first enhancement transistor of the other of said two circuits.

22. A buffer circuit according to claims, 1 or 2, wherein
    said gate electrode of said first enhancement transistor of one of said two circuits is coupled to said gate electrode and said source electrode of said second depletion transistor of the other of said two circuits, and
    said input circuit includes
        an input terminal coupled to said gate electrode of said second depletion transistor of said one of said two circuits and said gate electrode of said first enhancement transistor of said other of said two circuits.

* * * * *